(12) United States Patent
Tanaka et al.

(10) Patent No.: US 9,937,881 B2
(45) Date of Patent: Apr. 10, 2018

(54) KNUCKLE STRUCTURE

(71) Applicant: HONDA MOTOR CO., LTD., Minato-Ku, Tokyo (JP)

(72) Inventors: Hiroki Tanaka, Wako (JP); Akira Takeishi, Wako (JP); Masahiko Komatsubara, Wako (JP); Hiroaki Morikubo, Wako (JP); Koichi Ono, Wako (JP); Taro Genda, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 0 days.

(21) Appl. No.: 15/500,181

(22) PCT Filed: Apr. 27, 2015

(86) PCT No.: PCT/JP2015/062642
§ 371 (c)(1),
(2) Date: Jan. 30, 2017

(87) PCT Pub. No.: WO2016/017226
PCT Pub. Date: Feb. 4, 2016

(65) Prior Publication Data
US 2017/0259760 A1    Sep. 14, 2017

(30) Foreign Application Priority Data

Jul. 31, 2014   (JP) ................... 2014-156449

(51) Int. Cl.
| | |
|---|---|
| *B60R 16/02* | (2006.01) |
| *B60G 3/18* | (2006.01) |
| *H01B 7/00* | (2006.01) |
| *H05K 9/00* | (2006.01) |

(52) U.S. Cl.
CPC ........... *B60R 16/02* (2013.01); *B60G 3/18* (2013.01); *H01B 7/0045* (2013.01); *H01B 7/0054* (2013.01); *H05K 9/0064* (2013.01); *B60G 2300/50* (2013.01)

(58) Field of Classification Search
CPC .... B60R 16/02; H05K 9/0064; H01B 7/0045; H01B 7/0054; B60G 3/18; B60G 2300/50
See application file for complete search history.

(56) References Cited

FOREIGN PATENT DOCUMENTS

| JP | H01-299925 A | 12/1989 |
|---|---|---|
| JP | H09-39531 A | 2/1997 |
| JP | 2009-029326 A | 2/2009 |
| JP | 2010-228734 A | 10/2010 |

OTHER PUBLICATIONS

Office Action dated Aug. 15, 2017, issued in the corresponding Japanese Patent Application 2016-538175.

*Primary Examiner* — Paul N Dickson
*Assistant Examiner* — Joselynn Y Sliteris
(74) *Attorney, Agent, or Firm* — Carrier Blackman & Associates, P.C.; William D. Blackman; Jingli Wang

(57) ABSTRACT

A knuckle structure is provided with: a knuckle for rotatably supporting a drive shaft connected to the output shaft of a motor; and a grounding member having a grounding harness, the grounding member electrically connecting the knuckle and a vehicle body. The grounding member is connected to a grounding connection section provided on the protrusion of the knuckle and facing rearward of the vehicle. The grounding connection section is provided between a brake caliper extending in the front-rear direction of the vehicle and the knuckle.

3 Claims, 6 Drawing Sheets

KNUCKLE STRUCTURE

TECHNICAL FIELD

The present invention relates to a knuckle structure which is arranged in a vehicle suspension system.

BACKGROUND ART

Because of the recent electrical motorization of vehicles, vehicles using motors as rotational driving sources are increasing. In the case where motors are used as rotational driving sources, noise is produced in rotors constituting the motors and transmitted to knuckles through a driveshaft, and is further externally radiated to cause radio noise. For example, an antenna of an in-vehicle radio picks up the above noise to produce the radio noise.

As a countermeasure to the radio noise as above, according to Patent Literature 1, the radio noise is dissipated to the vehicle body side for preventing the external radiation of the radio noise, by grounding realized by electrically connecting a parking brake wire and a carrier which is arranged rotatably relative to the axle.

CITATION LIST

Patent Literature

Patent Literature 1: Japanese Patent Laid-open No. 2009-29326

SUMMARY OF INVENTION

Technical Problem

In order to connect the knuckle arranged in a suspension system to a ground (GND) on the vehicle body side, for example, it is possible to consider to electric connection of a harness to the knuckle for dissipating the radio noise to the vehicle body side.

However, the knuckle is arranged in a position of which the ambient environment is likely to vary because of the external environment (e.g., water, oil, snow, dust, heat, and the like). For example, snow sticking to the knuckle can break a connection in the harness. There is a demand for stable connection of the harness to the knuckle at a position of which the external environment severely varies.

The object of the present invention is to provide a knuckle structure which can suppress radio noise and improve the performance in resistance to the environment.

Solution to Problem

In order to achieve the above object, the present invention provides a knuckle structure including: a knuckle which rotatably supports a driveshaft connected to an output shaft of a driving motor; and a grounding member which electrically connects the knuckle and a vehicle body. The present invention is characterized in that the grounding member is connected to a side face of the knuckle which faces rearward with respect to the orientation of the vehicle, or to a side face of the knuckle which faces forward with respect to the orientation of the vehicle.

According to the present invention, the grounding member is connected to a side face of the knuckle which faces rearward with respect to the orientation of the vehicle, or to a side face of the knuckle which faces forward with respect to the orientation of the vehicle. Therefore, for example, water, oil, snow, dust, and the like from the road surface is less likely to directly hit the connection, and influence of heat from the road surface on the connection can be reduced. Since the grounding with the grounding member is performed at the position as above according to the present invention, the radio noise from the motor, which is a problem in hybrid cars and electric cars, can be reduced. Therefore, it is possible to make the reception quality of electronic devices such as the radio satisfactory, and improve the performance in resistance to the environment.

In addition, according to the present invention, the improvement in the performance in resistance to the environment eliminates the need for the provision of a protection member which protects the harness (the grounding member) against water, snow, and the like, and can realize a simpler structure. Therefore, it is possible to reduce the unsprung weight in the suspension system, and manufacture the knuckle structure at lower cost.

Further, another feature of the present invention is that the side face of the knuckle to which the grounding member is connected is arranged between a brake caliper in a braking mechanism and the knuckle.

According to the present invention, even when snow sticks to the knuckle, the snow can be melted and removed, by the heat generation by the break caliper which is located near the side face of the knuckle. Therefore, according to the present invention, it is possible to prevent a fall of the harness caused by the influence of the snow.

In addition, according to the present invention, in the case where the grounding member is connected to the side face, facing forward with respect to the orientation of the vehicle, of the knuckle which constitutes the rear suspension, the brake caliper located more forward than the knuckle functions as a protection wall for the knuckle. Thus, the grounding face, on which the grounding member is connected to the knuckle, can be protected from, for example, chipping by the stones which fly from the front wheel.

A further feature of the present invention is that the grounding member has a harness for grounding, the resistance R of which is greater than zero $\Omega$ and not greater than 10$\Omega$ (0<R≤10).

According to the present invention, the electric field strength of the radio noise begins to decrease at a critical value near 10$\Omega$ of the resistance R of the harness for grounding. Therefore, when the upper limit of the resistance R of the harness for grounding corresponding to the electric field strength of the radio noise is set greater than zero $\Omega$ and not greater than 10$\Omega$, it is possible to use an inexpensive harness. Thus, manufacture can be achieved at lower cost.

Advantageous Effect of Invention

According to the present invention, it is possible to obtain a knuckle structure which can suppress radio noise and improve the performance in resistance to the environment.

DESCRIPTION OF EMBODIMENT

Figure 1:
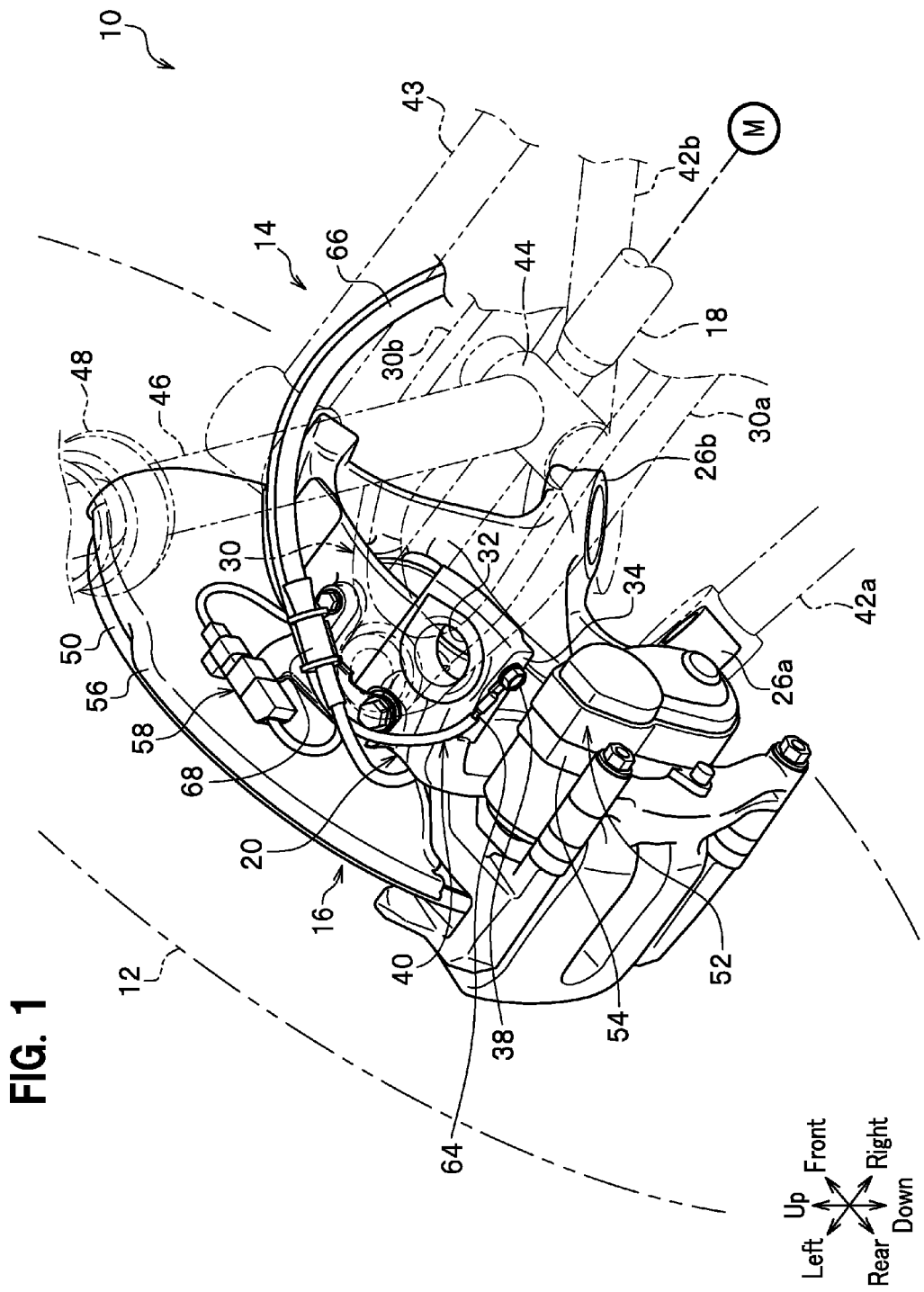
FIG. 1 is a perspective view of a suspension and braking system to which a knuckle structure according to an embodiment of the present invention is applied.
Figure 2:
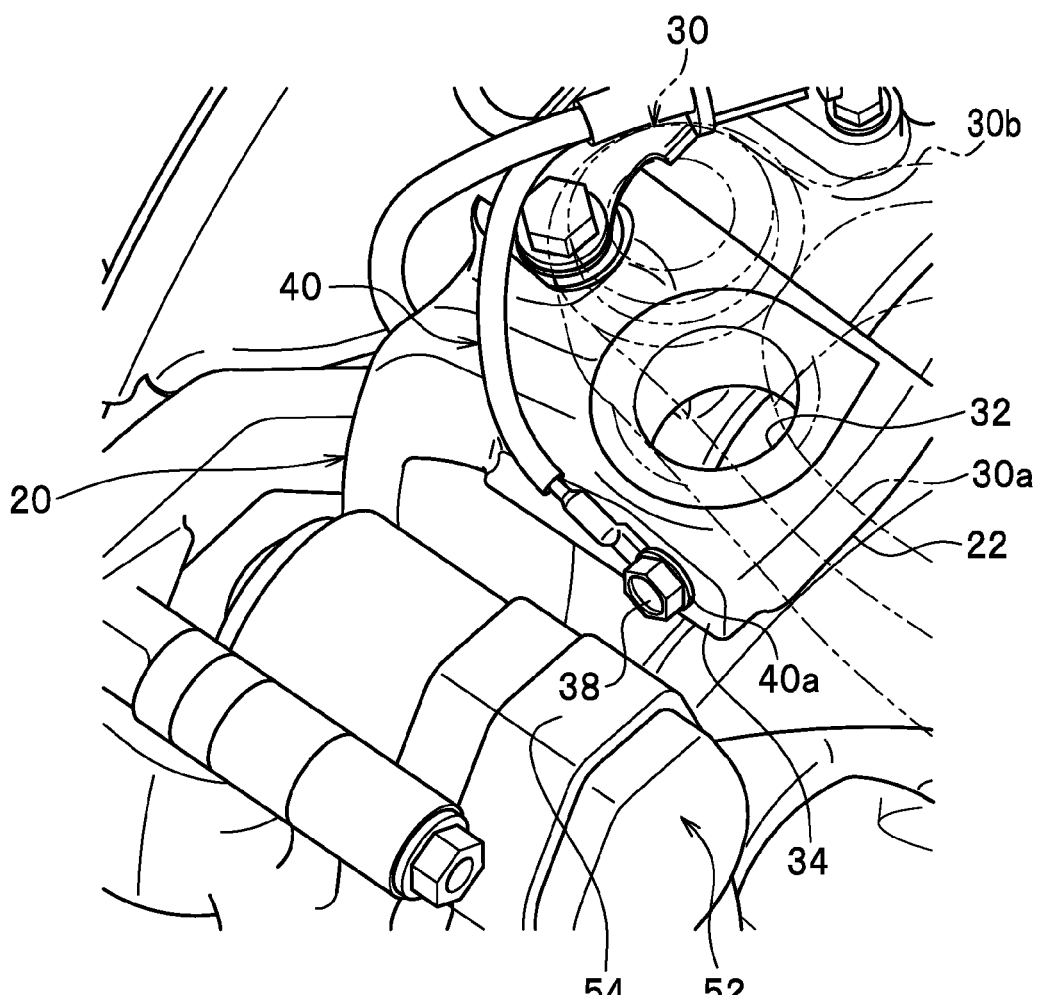
FIG. 2 is a partially magnified perspective view of FIG. 1.
Figure 2:
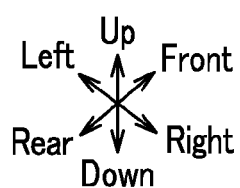

An embodiment of the present invention is explained in detail with reference to drawings when necessary. FIG. 1 is a perspective view of a suspension and braking system to which a knuckle structure according to an embodiment of the present invention is applied. FIG. 2 is a partially magnified perspective view of FIG. 1.

As illustrated in FIG. 1, a suspension and braking system 10 is constituted by a suspension mechanism 14 and a braking mechanism 16. The suspension mechanism 14 is connected to a subframe (not shown) of the vehicle and supports a left rear wheal (travelling wheel) 12, and the braking mechanism 16 brakes the left rear wheal 12.

The suspension mechanism 14 includes a knuckle 20 and a plurality arms. The knuckle 20 rotatably supports a driveshaft 18, which is connected to an output shaft of a motor (driving motor) M. The knuckle 20 is formed of a conductive material. The plurality arms support the knuckle 20, and suspend the knuckle 20 from the subframe (not shown).

Figure 3:
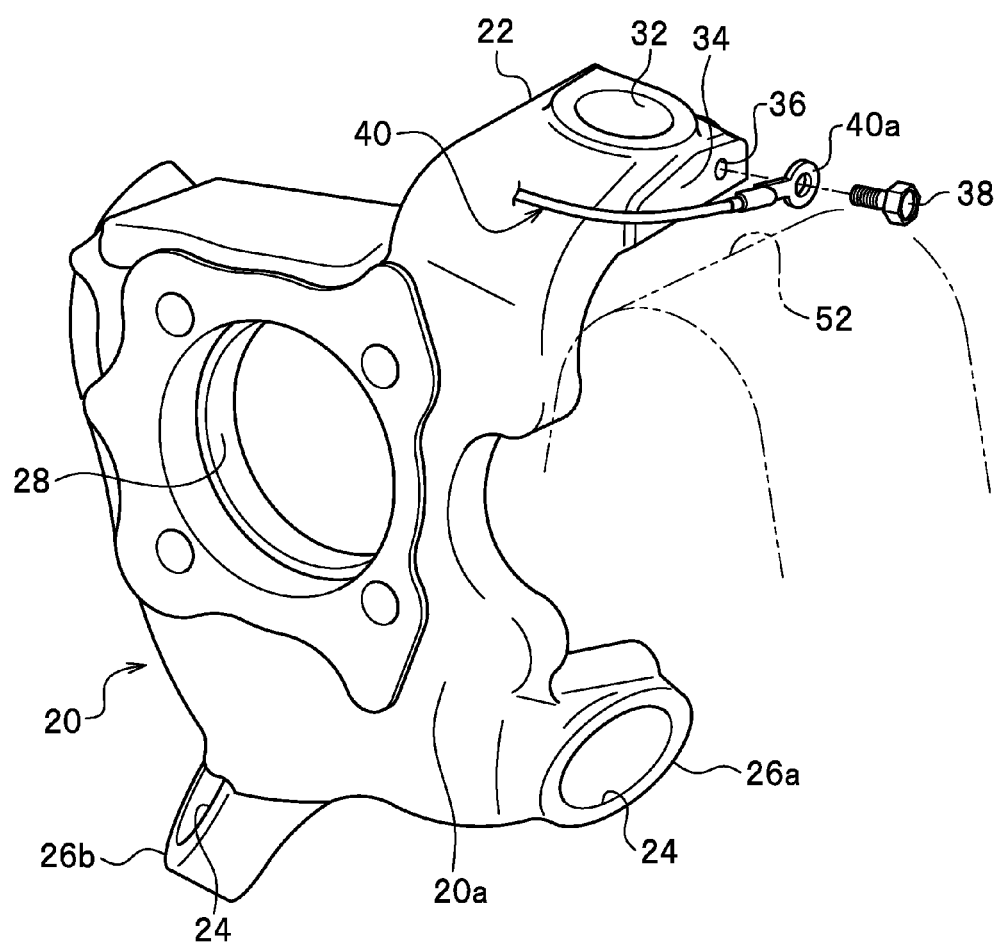
FIG. 3 is an exploded perspective view illustrating a configuration in which a terminal of a grounding member is fastened, with a bolt, to a grounding connection portion of the knuckle which faces rearward with respect to the orientation of the vehicle.

FIG. 3 is an exploded perspective view illustrating a configuration in which a terminal of a grounding member is fastened, with a bolt, to a grounding connection portion of the knuckle which faces rearward with respect to the orientation of the vehicle.

As illustrated in FIG. 3, the knuckle 20 includes a knuckle body 20a, a protruding portion 22, and two annular portions 26a and 26b. The protruding portion 22 approximately horizontally extends from the upper portion of the knuckle body 20a toward the subframe (not shown) side (the inside of the vehicle body). Each of the two annular portions 26a and 26b is arranged integrally with the lower portion of the knuckle body 20a and has a through-hole 24. A through-hole 28 through which the driveshaft 18 penetrates is formed approximately at the center of the knuckle body 20a.

In the protruding portion 22, a connection bore 32 with which an upper arm 30 (See FIG. 1) is connected through a rubber bush (not shown) is formed in the protruding portion 22. In addition, a grounding connection portion 34 formed as a flat face having an approximately rectangular shape and facing rearward with respect to the orientation of the vehicle is arranged in the protruding portion 22. The grounding connection portion 34 functions as the "side face facing rearward with respect to the orientation of the vehicle" of the knuckle 20. A terminal 40a (explained later) of a grounding member 40 is fastened by screwing a bolt 38 into a screw hole 36 in the grounding connection portion 34. Thus, the grounding member 40 is electrically connected to the knuckle 20.

As illustrated in FIG. 1, the plurality of arms include the upper arm 30, a first lower arm 42a, a second lower arm 42b, and a control arm 43. The upper arm 30 has an "A" shape in plan view. An end of the upper arm 30 on the vehicle outer side is connected to the protruding portion 22 (See FIG. 3) of the knuckle 20, and another end of the vehicle inner side of the upper arm 30 is connected to the subframe (not shown). Ends of the first lower arm 42a and the second lower arm 42b on the vehicle outer side are respectively connected to the two annular portions 26a and 26b of the knuckle 20, and other ends of the first lower arm 42a and the second lower arm 42b on the vehicle inner side are connected to the subframe (not shown). The control arm 43 is connected to an intermediate portion of the knuckle 20.

A suspension portion 44 for suspending two arm portions 30a and 30b which branch out from the end of the upper arm 30 is arranged between the end and the other end of the upper arm 30. A damper 46 and a coil spring 48 are connected to the suspension portion 44 through a bolt (not shown).

The braking mechanism 16 includes a brake disk 50 and a brake caliper 52. The brake disk 50 has a disk-like shape. The brake caliper 52 has a housing 54. Brake pads (not shown) and a plurality of pistons (not shown) for pressing the brake pads to the brake disk 50 side are arranged inside the housing 54.

The brake caliper 52 is arranged close to the grounding connection portion 34 of the knuckle 20 and opposed to the grounding connection portion 34 in the front-rear direction of the vehicle. In other words, the grounding connection portion 34 is arranged between the knuckle 20 and the brake caliper 52. The friction heat generated between the brake disk 50 and the pistons (not shown) is transmitted to the brake caliper 52, so that the brake caliper 52 functions as a heat generation source.

A disk cover 56 which covers the brake disk 50 is provided with a wheel speed sensor (ABS sensor) 58 for detecting the rotational speed of the left rear wheal 12. A pair of harnesses for ABS (not shown) which have a small diameter are connected to the wheel speed sensor 58. In addition, an electric parking brake (not shown) is arranged at a position near the knuckle 20. A pair of harnesses for EPB (not shown) which have a large diameter are connected to the electric parking brake.

As illustrated in FIG. 1, the grounding member 40 has a single harness for grounding 64, which is connected to the grounding connection portion 34. In addition, a tube member 66 which integrally covers the harnesses for ABS and the harnesses for EPB (which are not shown) is provided. The harness for grounding 64 is arranged on the outer circumferential surface of the tube member 66 through a winding means (not shown). The harness for grounding 64 is arranged to extend along the tube member 66 and branch from a branching portion 68, which is located above the knuckle 20.

The harnesses for ABS and the harnesses for EPB (which are not shown) are electrically connected to an ECU (Electronic Control Unit) through connectors. In addition, the harness for grounding 64 is grounded to the conductive vehicle body through a terminal (not shown).

The suspension and braking system 10 to which the knuckle structure according to the present embodiment is applied is basically configured as above. Next, the operations and advantageous effects of the suspension and braking system 10 are explained below.

According to the present embodiment, the grounding member 40 is connected to the grounding connection portion 34, which is a side face of the knuckle 20 facing rearward with respect to the orientation of the vehicle. Therefore, for example, water, oil, snow, dust, and the like from the road surface is less likely to directly hit the connection, and influence of heat from the road surface on the connection can be reduced. Since the grounding with the grounding member 40 is performed at the position as above according to the present embodiment, the radio noise from the motor M, which is a problem in hybrid cars and electric cars, can be reduced. Therefore, it is possible to make the reception quality of electronic devices such as the radio satisfactory, and improve the performance in resistance to the environment.

In addition, according to the present embodiment, the improvement in the performance in resistance to the environment eliminates the need for the provision of a protection member which protects the harness for grounding 64 from water, snow, and the like, and can realize a simpler structure. Therefore, according to the present embodiment, the unsprung weight in the suspension system 14 can be reduced, and manufacture at lower cost is enabled.

Further, according to the present embodiment, the grounding connection portion 34 to which the grounding member 40 is connected is arranged between the brake caliper 52 in the braking mechanism 16 and the knuckle 20. Therefore, if snow sticks to the knuckle 20, the snow can be melted and removed, by the heat generation by the break caliper 52, which is located near the side face of the knuckle 20. Therefore, it is possible to prevent a fall of the harness for grounding 64 caused by the influence of the snow.

Next, a case where the grounding member 40 is connected to the grounding connection portion 34, which is a side face of the knuckle 20 facing forward with respect to the orientation of the vehicle contrary to the case of FIG. 3, is explained below.

Figure 4:
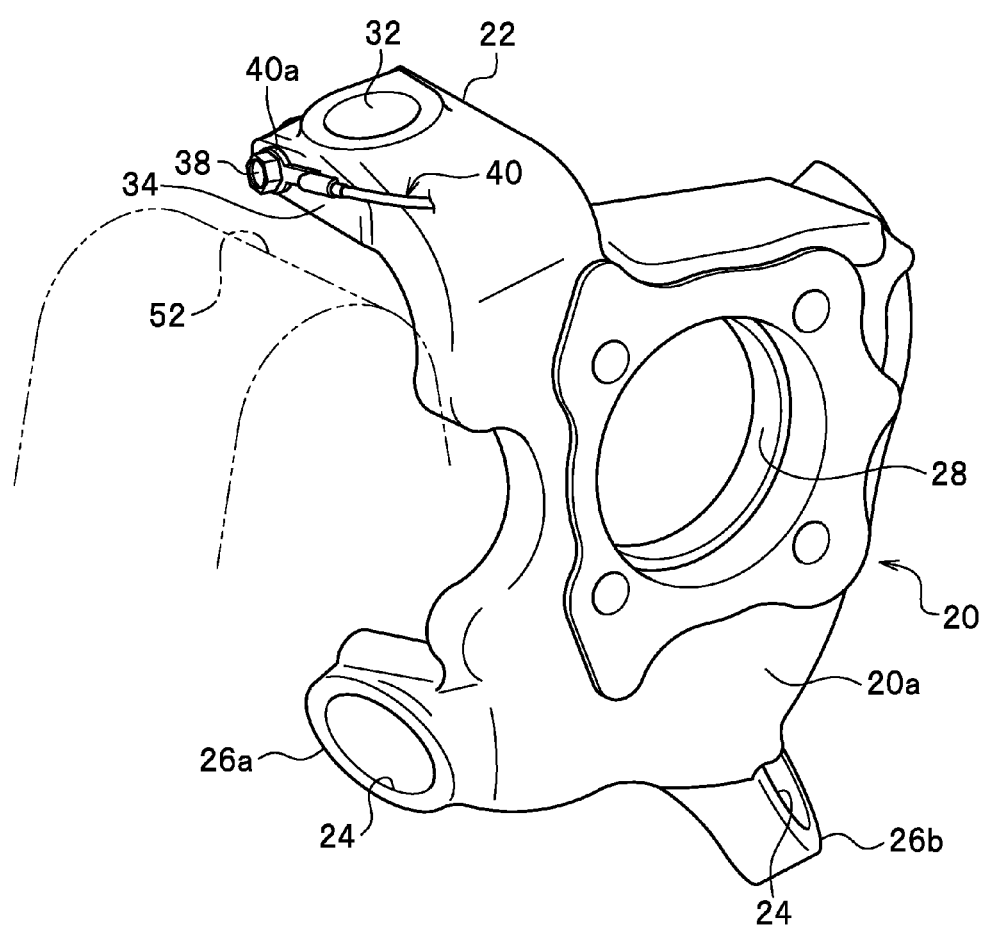
FIG. 4 is a perspective view illustrating a configuration in which a grounding member is fastened, with a bolt, to a grounding connection portion of the knuckle which faces forward with respect to the orientation of the vehicle.

FIG. 4 is a perspective view illustrating a configuration in which a grounding member is fastened, with a bolt, to the grounding connection portion of the knuckle which faces forward with respect to the orientation of the vehicle. In FIG. 4, the same or corresponding constituent elements as or to the constituent elements illustrated in FIG. 3 bear the same reference numbers as FIG. 3, and the explanations on such elements are not repeated here.

As illustrated in FIG. 4, in the case where the grounding member 40 is connected to the grounding connection portion 34 as the side face, facing forward with respect to the orientation of the vehicle, of the knuckle 20 constituting the rear suspension, the brake caliper 52, which is located more forward, with respect to the orientation of the vehicle, than the knuckle 20, functions as a protection wall for the knuckle 20. Therefore, the grounding connection portion 34 (grounding face) can be protected from, for example, chipping by the stones which fly from the front wheel.

Although the present embodiment are explained for the knuckle 20 equipped at the rear wheel, the present embodiment is not limited to the rear wheel, and the grounding connection portion 34 can be attached to a knuckle 20 equipped at a front wheel. In this case, the grounding connection portion 34 is a side face, facing rearward with respect to the orientation of the vehicle, of the knuckle 20 equipped at the front wheel, or a side face, facing forward with respect to the orientation of the vehicle, of the knuckle 20 equipped at the front wheel, and the grounding member 40 is connected to the grounding connection portion 34.

Next, setting of the resistance of the harness for grounding 64 connected to the grounding connection portion 34 is considered below.

Figure 5A:
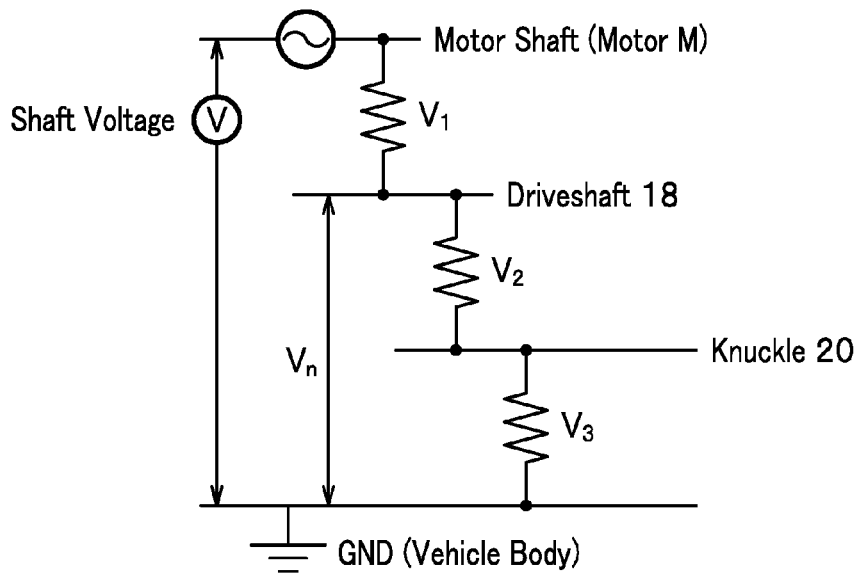
FIG. 5A is a diagram illustrating an equivalent circuit which indicates the potential differences between the GND (vehicle body), the motor shaft, the driveshaft, and the knuckle in a comparison example in which the harness for grounding is not arranged.
Figure 5B:
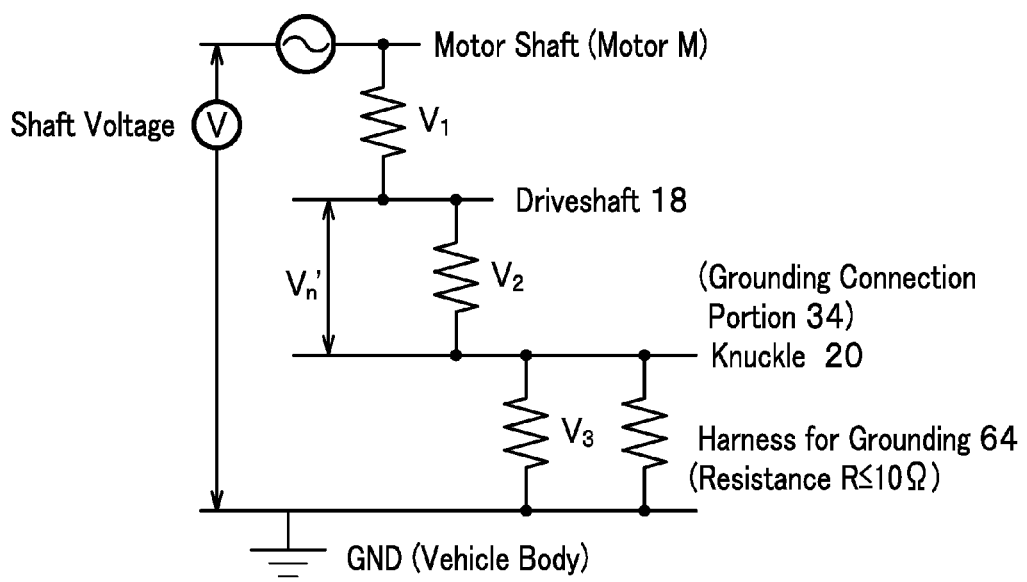
FIG. 5B is a diagram illustrating an equivalent circuit which indicates the potential differences between the GND (vehicle body), the motor shaft, the driveshaft, and the knuckle in the present embodiment in which the harness for grounding is arranged.

FIG. 5A is a diagram illustrating an equivalent circuit which indicates the potential differences between the GND (vehicle body), the motor shaft, the driveshaft, and the knuckle in a comparison example in which the harness for grounding is not arranged, and FIG. 5B is a diagram illustrating an equivalent circuit which indicates the potential differences between the GND (vehicle body), the motor shaft, the driveshaft, and the knuckle in the present embodiment in which the harness for grounding is arranged.

It is assumed that the only difference between the comparison example illustrated in FIG. 5A and the present embodiment illustrated in FIG. 5B is the presence or absence of the harness for grounding 64 connected to the grounding connection portion 34 of the knuckle 20, and the configurations in all the other portions are identical in the comparison example and the present embodiment.

In the equivalent circuit illustrated in FIGS. 5A and 5B, $V_1$ denotes the potential difference between the motor shaft of motor M and the driveshaft 18, $V_2$ denotes the potential difference between the driveshaft 18 and the knuckle 20, $V_3$ denotes the potential difference between the knuckle 20 and the GND (vehicle body), and V denotes the total potential difference between the motor shaft and the GND (vehicle body).

In the comparison example illustrated in part (a) of FIG. 5 (a), the potential difference causing the radio noise is the potential difference $V_n$ between the driveshaft 18 and the GND (vehicle body).

In contrast, in the present embodiment as illustrated in FIG. 5B, the knuckle 20 is grounded by connecting the knuckle 20 and the GND (vehicle body) with the harness for grounding 64, and the resistance (grounding resistance) R of the harness for grounding 64 is set equal to or greater than 10Ω (R≤10). Thus, in the present embodiment, the electric potentials of the knuckle 20 and the vehicle body are approximately equal, and the potential difference $V_n'$ between the driveshaft 18 and the knuckle 20, which causes the radio noise, can be made so small as to be ignorable compared with the potential difference $V_n$ between the driveshaft 18 and the GND (vehicle body), i.e., $V_n' \ll V_n$.

Figure 6:
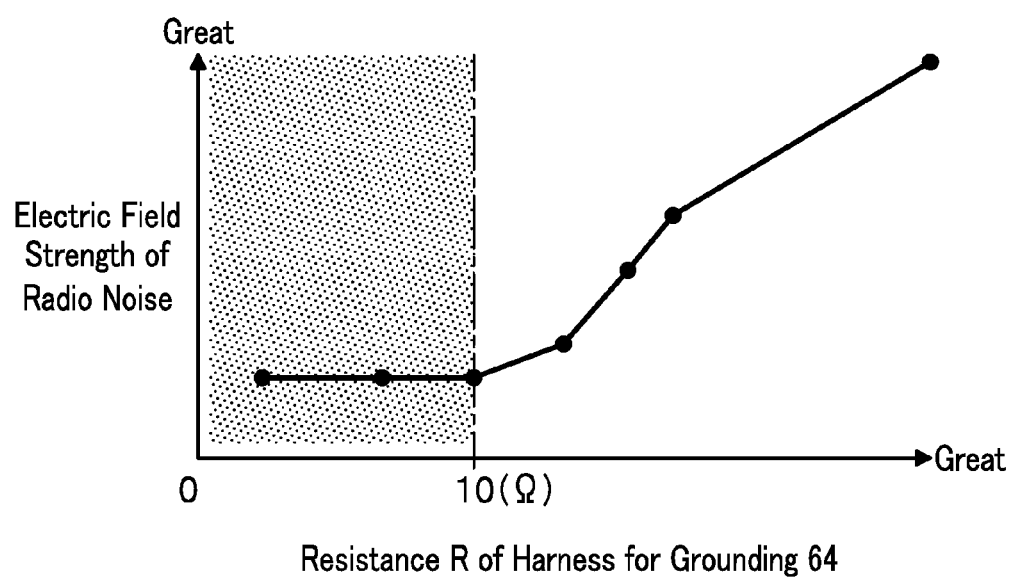
FIG. 6 is an explanatory diagram indicating a relationship between the electric field strength of the radio noise and the resistance of the harness for grounding in the present embodiment.

FIG. 6 is an explanatory diagram indicating a relationship between the electric field strength of the radio noise and the resistance of the harness for grounding in the present embodiment.

As understood from the characteristic curve indicated in FIG. 6, after the resistance R of the harness for grounding 64 decreases through the critical value of approximately 10Ω, the electric field strength of the radio noise comes into the (dotted) region in which the electric field strength is maintained approximately at a constant value as the lower limit. Therefore, when the upper limit of the resistance R of the harness for grounding 64 corresponding to the electric field strength of the radio noise is set greater than 0Ω and not exceeding 10Ω (i.e., 0<R≤10), it is possible to reduce the radio noise, and use an inexpensive harness being commercially available and having the resistance near 10Ω. Thus, the suspension and braking system 10 can be manufactured at lower cost.

LIST OF REFERENCE SIGNS

10: Suspension and Braking System
12: Left Rear Wheal (Travelling Wheel)

16: Braking Mechanism
18: Driveshaft
20: Knuckle
34: Grounding Connection Portion (Side Face)
40: Grounding Member
52: Brake Caliper
64: Harness for Grounding
M: Motor (Driving Motor)

The invention claimed is:

1. A knuckle structure comprising:
a knuckle which rotatably supports a driveshaft connected to an output shaft of a driving motor; and
a grounding member which electrically connects the knuckle and a vehicle body;
wherein:
the grounding member is connected to a side face of a protruding portion of the knuckle, which protrudes toward an inner side of a vehicle from an upper side of the knuckle, the side face facing rearward or forward with respect to an orientation of the vehicle body, and
the side face of the protruding portion of the knuckle, to which the grounding member is connected, is arranged between a brake caliper of a braking mechanism and a knuckle body portion of the knuckle.

2. The knuckle structure according to claim 1, wherein the grounding member has a harness for grounding, a resistance R of which is greater than zero Ω and not greater than 10 Ω (0<R≤10).

3. A knuckle structure comprising:
a knuckle which rotatably supports a driveshaft connected to an output shaft of a driving motor; and
a grounding member which electrically connects the knuckle and a vehicle body; wherein the grounding member is connected to a side face of the knuckle which faces rearward with respect to an orientation of a vehicle, or to a side face of the knuckle which faces forward with respect to the orientation of the vehicle, and
wherein:
the grounding member has a harness for grounding, a resistance R of which is greater than zero Ω and not greater than 10Ω (0<R≤10).

* * * * *